United States Patent
Nam et al.

(10) Patent No.: US 12,525,547 B2
(45) Date of Patent: Jan. 13, 2026

(54) SEMICONDUCTOR PACKAGE AND METHOD FOR MANUFACTURING SAME

(71) Applicant: NEPES CO., LTD., Cheongju-si (KR)

(72) Inventors: Ju Hyun Nam, Cheongju (KR); Jun Kyu Lee, Cheongju (KR); Yong Tae Kwon, Cheongju (KR); Su Yun Kim, Cheongju (KR); Dong Hoon Oh, Seoul (KR)

(73) Assignee: NEPES CO., LTD., Cheongju-si (KR)

( * ) Notice: Subject to any disclaimer, the term of this patent is extended or adjusted under 35 U.S.C. 154(b) by 861 days.

(21) Appl. No.: 17/442,796

(22) PCT Filed: Mar. 24, 2020

(86) PCT No.: PCT/KR2020/004005
§ 371 (c)(1),
(2) Date: May 20, 2022

(87) PCT Pub. No.: WO2020/204440
PCT Pub. Date: Oct. 8, 2020

(65) Prior Publication Data
US 2022/0278053 A1    Sep. 1, 2022

(30) Foreign Application Priority Data

Mar. 29, 2019  (KR) .................. 10-2019-0037309
Feb. 24, 2020  (KR) .................. 10-2020-0022413

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4857* (2013.01); *H01L 23/3128* (2013.01);
(Continued)

(58) Field of Classification Search
CPC .......... H01L 21/4857; H01L 2224/214; H01L 2224/1035; H01L 2225/1058;
(Continued)

(56) References Cited

U.S. PATENT DOCUMENTS 9,780,042 B2   10/2017  Woychik et al.
10,770,418 B2   9/2020  Kim et al.
(Continued)

FOREIGN PATENT DOCUMENTS

KR     10-1253514 B1       4/2013
KR   10-2014-0026570 A     3/2014
(Continued)

OTHER PUBLICATIONS

Chen, Peng, et al., "On the Effective Coefficient of Thermal Expansion (CTE) of Bilayer/Trilayer in Semiconductor Package Substrates," IEEE 65th Electronic Components and Technology Conference (ECTC), pp. 1932-1937 (Year: 2015).*
(Continued)

*Primary Examiner* — Fernando L Toledo
*Assistant Examiner* — Ryan T. Fortin
(74) *Attorney, Agent, or Firm* — Crowell & Moring LLP

(57) ABSTRACT

A semiconductor package, as a semiconductor package mounted on a circuit board, includes including: a body portion including a semiconductor chip, and a first surface and a second surface opposite to each other; and a structure including n insulating layers stacked on at least one of the first surface and the second surface of the body portion, wherein the semiconductor package has a predetermined target coefficient of thermal expansion (CTE), and the n insulating layers and the body portion have a thickness and a CTE satisfying a condition that an effective CTE of the semiconductor package becomes equal to the predetermined target CTE.

3 Claims, 7 Drawing Sheets

(51) Int. Cl.
  *H01L 23/31* (2006.01)
  *H01L 23/538* (2006.01)
  *H01L 25/10* (2006.01)

(52) U.S. Cl.
  CPC ...... *H01L 23/5383* (2013.01); *H01L 23/5386* (2013.01); *H01L 23/5389* (2013.01); *H01L 24/19* (2013.01); *H01L 24/20* (2013.01); *H01L 25/105* (2013.01); *H01L 2224/214* (2013.01); *H01L 2225/1035* (2013.01); *H01L 2225/1058* (2013.01); *H01L 2924/3511* (2013.01)

(58) Field of Classification Search
  CPC ............... H01L 23/562; H01L 23/3128; H01L 23/5383; H01L 23/5386; H01L 23/5389; H01L 24/19; H01L 24/20; H01L 25/105; H01L 2924/3511
  See application file for complete search history.

(56) References Cited

U.S. PATENT DOCUMENTS

| | | | | |
|---|---|---|---|---|
| 2005/0269719 | A1* | 12/2005 | Hack | H01L 23/295 257/E23.125 |
| 2006/0001158 | A1* | 1/2006 | Matayabas | H01L 23/3135 257/E23.126 |
| 2013/0328191 | A1 | 12/2013 | Meyer et al. | |
| 2017/0141043 | A1* | 5/2017 | Park | H01L 23/5386 |
| 2019/0074260 | A1* | 3/2019 | Hsu | H01L 23/145 |
| 2020/0014090 | A1* | 1/2020 | Jung | H01Q 1/38 |
| 2020/0069705 | A1 | 3/2020 | Borody | |

FOREIGN PATENT DOCUMENTS

| | | |
|---|---|---|
| KR | 10-2015-0053952 A | 5/2015 |
| KR | 10-2018-0024834 A | 3/2018 |

OTHER PUBLICATIONS

Oi, Yosuke, et al., "Warpage Control of Liquid Molding Compound for Fan-Out Wafer Level Packaging", IEEE 68th Electronic Components and Technology Conference (ECTC), pp. 967-972 (Year: 2018).*

Mawer, Andrew, et al., "Effect of Package Warpage and Composite CTE on Failure Modes in Board-Level Thermal Cycling", Proceedings of SMTA International, Oct. 14-18, 2018 (Year: 2018).*

Sato, Yutaka, et al., "Spherical SiO2 Filler for Semiconductor Sealing Materials", Nippon Steel & Sumitomo Metal Technical Report No. 117, pp. 44-48 (Year: 2017).*

Chen, Peng, et al., "Warpage Prediction Methodology of Extremely Thin Packages", Proceedings of the 2017 IEEE 67th Electronic Components and Technology Conference, pp. 2080-2085 (Year: 2017).*

International Search Report and English translation for PCT/KR2020/004005 mailed Jul. 3, 2020, 7 pages.

* cited by examiner

SEMICONDUCTOR PACKAGE AND METHOD FOR MANUFACTURING SAME

RELATED APPLICATIONS

The present patent document claims the benefit of priority to PCT Patent Application No. PCT/KR2002/004005, filed Mar. 24, 2020, and entitled "SEMICONDUCTOR PACKAGE AND METHOD FOR MANUFACTURING SAME," the entire contents of each of which are incorporated herein by reference. PCT Patent Application No. PCT/KR2020/004005 claims priority to Korean Patent Application No. 10-2019-0037309, filed on Mar. 29, 2019, which is also incorporated herein by reference in its entirety. PCT Patent Application No. PCT/KR2020/004005 also claims priority to Korean Patent Application No. 10-2020-0022413, filed on Feb. 24, 2020, which is also incorporated herein by reference in its entirety.

TECHNICAL FIELD

A technical idea of the present disclosure relates to a semiconductor package and a method for manufacturing the same, and more particularly, to a reliability-improved wafer level semiconductor package and a method for manufacturing the same.

BACKGROUND ART

In general, semiconductor packages are manufactured by performing a semiconductor packaging process on semiconductor chips manufactured by performing several semiconductor processes on a wafer. Recently, there has been proposed a wafer level packaging technique of performing a semiconductor packaging process at a wafer level and individualizing, into individual units, wafer level semiconductor packages having undergone the semiconductor packaging process to save production costs of the semiconductor packages.

Recently, along with the tendency of electronic devices to be lightweight, thin, and miniaturized, semiconductor packages have been gradually miniaturized and thinned. For a thin semiconductor package, there is a problem that warpage occurs due to a difference in a coefficient of thermal expansion between the semiconductor package and a circuit board on which the semiconductor package is mounted. This warpage causes a mechanical defect and an electrical defect of a semiconductor package and/or a semiconductor module including the semiconductor package, and thus, various attempts to suppress the warpage of the semiconductor package and/or the semiconductor module have been performed.

DESCRIPTION OF EMBODIMENTS

Technical Problem

A technical idea of the present disclosure provides a reliability-improved semiconductor package and a method for manufacturing the same.

Solution to Problem

A technical idea of the present disclosure provides a semiconductor package mounted on a circuit board, the semiconductor package including: a body portion including a semiconductor chip, and a first surface and a second surface opposite to each other; and a structure including n insulating layers (n is an integer greater than or equal to 2 and less than or equal to 100) stacked on at least one of the first surface and the second surface of the body portion, wherein the semiconductor package has a predetermined target coefficient of thermal expansion (CTE), the semiconductor package has an effective CTE calculated using Equation (1) below $$\text{effective } CTE = \frac{A*B + (C1*D1 + \cdots + Cn*Dn)}{A + (C1 + \cdots + Cn)} \quad (1)$$

where A denotes a thickness of the body portion, B denotes a CTE of the body portion, Cn denotes a thickness of an nth insulating layer of the n insulating layers, and Dn denotes a CTE of the nth insulating layer of the n insulating layers, and the n insulating layers and the body portion have a thickness and a CTE satisfying a condition that the effective CTE of the semiconductor package becomes equal to the predetermined target CTE.

In example embodiments, the target CTE is 60% to 90% of a CTE of the circuit board.

In example embodiments, the structure includes: a first insulating layer and a second insulating layer sequentially stacked on the first surface of the body portion; a first conductive redistribution pattern covered by the first insulating layer and the second insulating layer; and a third insulating layer covering the second surface of the body portion.

In example embodiments, the body portion further includes a molding layer covering a side surface of the semiconductor chip.

In example embodiments, the structure includes: a first redistribution structure on the first surface of the body portion; and a second redistribution structure on the second surface of the body portion, wherein the first redistribution structure includes: a first insulating layer and a second insulating layer sequentially stacked on the first surface of the body portion; and a first conductive redistribution pattern covered by the first insulating layer and the second insulating layer, the second redistribution structure includes: a fourth insulating layer and a fifth insulating layer sequentially stacked on the second surface of the body portion; and a second conductive redistribution pattern covered by the fourth insulating layer and the fifth insulating layer, and the body portion further includes a frame, at least a portion of which is covered by the molding layer, and which includes a through electrode electrically connecting the first conductive redistribution pattern to the second conductive redistribution pattern.

In example embodiments, the structure is an interposer, and the semiconductor chip is mounted on the interposer in a flip chip manner.

A technical idea of the present disclosure provides a method for manufacturing a semiconductor package, the method including: determining a target coefficient of thermal expansion (CTE) of the semiconductor package; determining a thickness and a CTE of a body portion including a semiconductor chip; and determining a thickness and a CTE of each of n insulating layers for a structure including the n insulating layers stacked on at least one of a first surface and a second surface of the body portion, which are opposite to each other, wherein the determining of the thickness and the CTE of each of the n insulating layers includes adjusting the CTE of each of the n insulating layers so as to satisfy a condition that an effective CTE of the semiconductor package calculated using Equation (1) below becomes equal to the predetermined target CTE $$\text{effective } CTE = \frac{A*B + (C1*D1 + \cdots + Cn*Dn)}{A + (C1 + \cdots + Cn)} \quad (1)$$

where A denotes a thickness of the body portion, B denotes a CTE of the body portion, Cn denotes a thickness of an nth insulating layer of the n insulating layers, and Dn denotes a CTE of the nth insulating layer of the n insulating layers.

In example embodiments, the determining of the CTE of each of the n insulating layers further includes adjusting content of a filler contained in each insulating layer to adjust the CTE of each of the n insulating layers, wherein the content of the filler is between 0 wt % and 88 wt %.

In example embodiments, the determining of the CTE of each of the n insulating layers further includes adjusting a size of a filler contained in each insulating layer to adjust the CTE of each of the n insulating layers, wherein the size of the filler is greater than 0 micrometers and less than or equal to 10 micrometers.

Advantageous Effects of Disclosure

In example embodiments of the present disclosure, a semiconductor package has the same or similar coefficient of thermal expansion (CTE) as or to that of a circuit board on which the semiconductor package is mounted, and thus, deformation such as warpage caused by a CTE difference between the semiconductor package and the circuit board may be suppressed, and damage to the semiconductor package, damage to an external connection terminal connecting the semiconductor package to the circuit board, and the like due to this deformation may be prevented. Accordingly, the reliability of a semiconductor package and a semiconductor module including the semiconductor package may be improved.

BEST MODE

Figure 1:
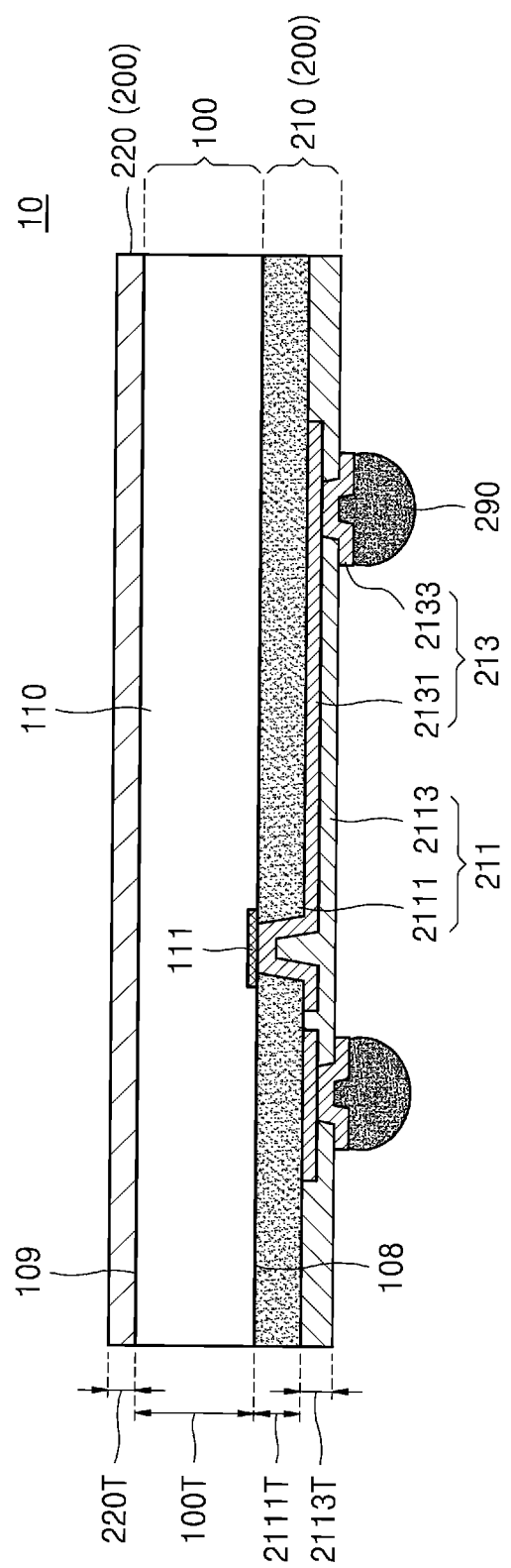
FIG. 1 is a cross-sectional view of a semiconductor package according to example embodiments of the present disclosure.

A semiconductor package according to the present disclosure, as a semiconductor package mounted on a circuit board, includes: a body portion including a semiconductor chip, and a first surface and a second surface opposite to each other; and a structure including n insulating layers stacked on at least one of the first surface and the second surface of the body portion. The semiconductor package has a predetermined target coefficient of thermal expansion (CTE), and the n insulating layers and the body portion have a thickness and a CTE satisfying a condition that an effective CTE of the semiconductor package becomes equal to the predetermined target CTE.

MODE OF DISCLOSURE

Hereinafter, example embodiments of the present disclosure will be described in detail with reference to the accompanying drawings. However, the example embodiments of the present disclosure may be modified to various other forms, and it should not be analyzed that the scope of the present disclosure is limited to the embodiments described below in detail. It is preferably analyzed that the example embodiments of the present disclosure are provided to more fully describe the concept of the present disclosure to those of ordinary skill in the art. Like reference numbers denote line elements throughout. Furthermore, various elements and regions in the drawings are schematically drawn. Therefore, the concept of the present disclosure is not limited to relative sizes or gaps drawn in the accompanying drawings.

Although terms, such as 'first' and 'second', can be used to describe various elements, the elements are not limited by the terms. The terms are used only to classify a certain element from another element. For example, a first element can be named a second element without leaving from the right scope of the present disclosure, and likely the second element can be named the first element.

The terminology used in the present disclosure is used only to describe specific embodiments and does not have any intention to limit the concept of the present disclosure. An expression in the singular includes an expression in the plural unless they are clearly different from each other in context. In the application, it should be understood that the expression, such as "include" or "have", is used to indicate the existence of an implemented feature, number, step, operation, element, part, or a combination thereof without excluding in advance the possibility of the existence or addition of one or more other features, numbers, steps, operations, elements, parts, or combinations thereof.

All terms used herein including technical or scientific terms have the same meaning as those generally understood by those of ordinary skill in the art unless they are defined differently. It should be understood that terms generally used, which are defined in a dictionary, have the same meaning as in context of related technology, and the terms are not to be understood as having an ideal or excessively formal meaning unless they are clearly defined in the application.

FIG. 1 is a cross-sectional view of a semiconductor package 10 according to example embodiments of the present disclosure.

Referring to FIG. 1, the semiconductor package 10 may include a first body portion 100 including a first semiconductor chip 110, and a first redistribution structure 210 on a first surface 108 of the first body portion 100. The semiconductor package 10 may have a fan-in wafer level package (FIWLP) structure.

In example embodiments, the first semiconductor chip 110 may be, for example, a memory semiconductor chip. The first semiconductor chip (the memory semiconductor chip) 110 may be a volatile memory semiconductor chip such as dynamic random access memory (DRAM) or static random access memory (SRAM) or a nonvolatile memory semiconductor chip such as phase-change random access memory (PRAM), magnetoresistive random access memory (MRAM), ferroelectric random access memory (FeRAM), or resistive random access memory (RRAM). Alternatively, in example embodiments, the first semiconductor chip 110 may be a logic chip. For example, the first semiconductor chip 110 may be a central processor unit (CPU), a microprocessor unit (MPU), a graphic processor unit (GPU), or an application processor (AP). The first semiconductor chip 110 may include various types of multiple individual devices formed therein.

The first semiconductor chip 110 may include a front side and a back side opposite to each other. The front side of the first semiconductor chip 110 may be a pad side with respect to which a chip pad 111 is provided. The chip pad 111 may be electrically connected to a semiconductor device formed in the first semiconductor chip 110. In example embodiments, the front side of the first semiconductor chip 110 may form the first surface 108 of the first body portion 100 and come in contact with the first redistribution structure 210. Although not particularly shown, a passivation layer is on the front side of the first semiconductor chip 110, and the passivation layer may cover the front side and include an opening portion through which the chip pad 111 is exposed.

In addition, although FIG. 1 shows that the semiconductor package 10 includes one semiconductor chip, the semiconductor package 10 may include two or more semiconductor chips. For example, the first semiconductor chip 110 may be a chip stack in which two or more semiconductor chips are vertically stacked. The two or more semiconductor chips included in the semiconductor package 10 may be the same or different types of semiconductor chips.

The first redistribution structure 210 may be provided on the first surface 108 of the first body portion 100 and formed through a redistribution process. The first redistribution structure 210 may include a first redistribution insulating layer 211 and a first conductive redistribution pattern 213.

The first redistribution insulating layer 211 may include a plurality of insulating layers sequentially stacked on the first surface 108 of the first body portion 100. For example, the first redistribution insulating layer 211 may include a first insulating layer 2111 and a second insulating layer 2113 sequentially stacked on the first surface 108 of the first body portion 100. In example embodiments, each of the first insulating layer 2111 and the second insulating layer 2113 may have the same planar area as the first body portion 100. Unlike illustrated in FIG. 1, the first redistribution insulating layer 211 may have a structure having one insulating layer or three or more insulating layers stacked therein.

Each of the first insulating layer 2111 and the second insulating layer 2113 may include an insulating polymer, epoxy, or a combination thereof. For example, each of the first insulating layer 2111 and the second insulating layer 2113 may include a material layer including an organic polymer material. For example, each of the first insulating layer 2111 and the second insulating layer 2113 may include a material layer including a photosensitive material or a material layer including a non-photosensitive material. For example, each of the first insulating layer 2111 and the second insulating layer 2113 may include photosensitive polyimide (PSPI) or non-photosensitive polyimide. Alternatively, each of the first insulating layer 2111 and the second insulating layer 2113 may include an oxide or a nitride. For example, each of the first insulating layer 2111 and the second insulating layer 2113 may include a silicon oxide or a silicon nitride.

The first insulating layer 2111 and the second insulating layer 2113 may include the same material or different materials. In addition, the first insulating layer 2111 and the second insulating layer 2113 may have the same coefficient of thermal expansion (CTE) or different CTEs. The CTE of each of the first insulating layer 2111 and the second insulating layer 2113 may be adjusted by a type of a polymer material layer constituting an insulating layer, or by a type, a size, and/or content of a filler contained in the polymer material layer constituting the insulating layer. For example, the insulating layer may include the polymer material layer and an inorganic filler contained in the polymer material layer. In this case, to decrease a CTE of the insulating layer, content or a size of the inorganic filler added to the polymer material layer may be increased. Alternatively, to increase the CTE of the insulating layer, the content or the size of the inorganic filler added to the polymer material layer may be decreased.

In example embodiments, the insulating layer includes a filler contained in a base material layer including a non-photosensitive material, and a size (or diameter) of the filler may be greater than 0 micrometers ($\mu$m) and less than or equal to 10 $\mu$m. In example embodiments, content of the filler may be between 0 wt % and 88 wt %.

The first conductive redistribution pattern 213 may be covered by the first redistribution insulating layer 211. The first conductive redistribution pattern 213 may electrically connect the chip pad 111 of the first semiconductor chip 110 to an external connection terminal 290. For example, the first conductive redistribution pattern 213 may include a first conductive pattern 2131 and a second conductive pattern 2133.

The first conductive pattern 2131 may include a line pattern between the first insulating layer 2111 and the second insulating layer 2113 and extending in a horizontal direction along the surface of the first insulating layer 2111, and a via pattern extending through an opening portion of the first insulating layer 2111 configured to expose the chip pad 111 of the first semiconductor chip 110. The via pattern of the first conductive pattern 2131 may extend along a side wall of the first insulating layer 2111, which is formed by the opening portion of the first insulating layer 2111, and electrically connect the line pattern of the first conductive pattern 2131 to the chip pad 111 of the first semiconductor chip 110. The second conductive pattern 2133 may be physically/electrically connected to the first conductive pattern 2131 through an opening portion of the second insulating layer 2113 configured to expose a portion of the first conductive pattern 2131. For example, a portion of the second conductive pattern 2133 may extend along a side wall of the second insulating layer 2113, which is formed by the opening portion of the second insulating layer 2113, and the other portion of the second conductive pattern 2133 may extend along a lower surface of the second insulating layer 2113.

In example embodiments, the second conductive pattern 2133 functions as an external connection pad and may be, for example, an under bump metal (UBM). The external connection terminal 290 may be on the second conductive pattern 2133.

The external connection terminal 290 may be, for example, a solder ball or a solder bump. The external connection terminal 290 may be electrically connected to the chip pad 111 of the first semiconductor chip 110 through the first conductive redistribution pattern 213 of the first redistribution structure 210. In addition, when the semiconductor package 10 is mounted on a circuit board, the external connection terminal 290 is connected to a substrate pad of the circuit board and may be configured to physically/electrically connect the semiconductor package 10 to the circuit board. However, in some example embodiments, the second conductive pattern 2133 may be omitted, and in this case, the external connection terminal 290 may be directly connected to the first conductive pattern 2131 exposed through the opening portion of the second insulating layer 2113.

For example, each of the first conductive pattern 2131 and the second conductive pattern 2133 may include copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or a combination thereof. The first conductive pattern 2131 and the second conductive pattern 2133 may include the same material or different materials.

The semiconductor package 10 may include a third insulating layer 220 on a second surface 109 opposite to the first surface 108 of the first body portion 100. The third insulating layer 220 may be, for example, a protective layer configured to protect the first semiconductor chip 110 by covering the back side of the first semiconductor chip 110. In example embodiments, the third insulating layer 220 may have the same planar area as the first body portion 100.

In the present embodiment, it may be defined that the semiconductor package 10 includes the first body portion 100 and a structure 200 on at least one of the first surface 108 and the second surface 109 of the first body portion 100. It may be defined that the structure 200 of the semiconductor package 10 includes the other structure of the semiconductor package 10 excluding the first body portion 100. In this case, the structure 200 may include n insulating layers (n is an integer greater than or equal to 2 and less than or equal to 100) stacked on at least one of the first surface 108 and the second surface 109 of the first body portion 100. For example, in the semiconductor package 10 shown in FIG. 1, the structure 200 may include the first insulating layer 2111 and the second insulating layer 2113 of the first redistribution structure 210, and the third insulating layer 220.

In this case, an effective CTE indicating an actual CTE of the semiconductor package 10 may be calculated based on a thickness 100T and a CTE of the first body portion 100 and a thickness and a CTE of each of the insulating layers stacked on at least one of the first surface 108 and the second surface 109 of the first body portion 100. Particularly, the effective CTE of the semiconductor package 10 may be calculated using Equation (1) below.

$$\text{effective } CTE = \frac{A*B + (C1*D1 + \cdots + Cn*Dn)}{A + (C1 + \cdots + Cn)} \quad (1)$$

where A denotes the thickness 100T of the first body portion 100, B denotes the CTE of the first body portion 100, Cn denotes a thickness of an nth insulating layer of the n insulating layers of the structure 200, and Dn denotes a CTE of the nth insulating layer of the n insulating layers of the structure 200. Herein, a thickness of one component is a thickness in a vertical direction and may indicate, for example, an average thickness in a direction orthogonal to the front side of the first semiconductor chip 110.

In some example embodiments, to calculate the effective CTE of the semiconductor package 10, another component, e.g., the first conductive redistribution pattern 213, included in the structure 200 may be further used in addition to the first body portion 100 and the insulating layers of the structure 200.

In the present embodiment, the effective CTE of the semiconductor package 10, which is calculated by Equation (1), may be adjusted to have the same or approximate value as or to that of a CTE of a circuit board on which the semiconductor package 10 is mounted. Herein, the circuit board may be, for example, a printed circuit board (PCB) but is not limited thereto. For example, the circuit board may be a metal core PCB (MCPCB), a metal PCB (MPCB), a flexible PCB (FPCB), or the like.

For example, the effective CTE of the semiconductor package 10, which is calculated by Equation (1), may satisfy a condition that the effective CTE becomes equal to a predetermined target CTE of the semiconductor package 10. For example, the thickness 100T and the CTE of the first body portion 100 of the semiconductor package 10 and the thickness and the CTE of each of the insulating layers stacked on at least one of the first surface 108 and the second surface 109 of the first body portion 100 may be adjusted to satisfy the condition that the effective CTE of the semiconductor package 10 becomes equal to the target CTE.

The target CTE of the semiconductor package 10 may be determined based on a CTE of a circuit board on which the semiconductor package 10 is mounted. The target CTE may be between 50% and 150% of the CTE of the circuit board. In example embodiments, the target CTE may be determined to be a value between 60% and 90% of the CTE of the circuit board. For example, when the CTE of the circuit board is 17 ppm/K, the target CTE may be determined to be a value between 10.2 ppm/K and 15.3 ppm/K.

In the present embodiment, the semiconductor package 10 may have the same or similar CTE as or to that of the circuit board. Because deformation such as warpage caused due to a CTE difference between the semiconductor package 10 and a circuit board may be suppressed, damage to the semiconductor package 10, damage to the external connection terminal 290 connecting the semiconductor package 10 to the circuit board, and the like due to this deformation may be prevented. Accordingly, the reliability of the semiconductor package 10 and a semiconductor module including the semiconductor package 10 may be eventually improved.

Figure 2:
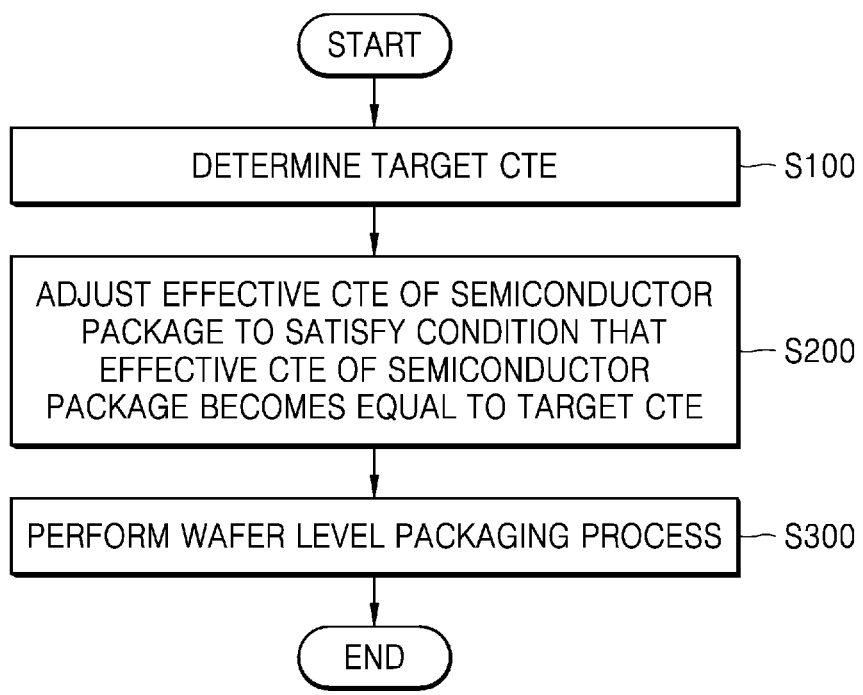
FIG. 2 is a flowchart of a method for manufacturing a semiconductor package, according to example embodiments of the present disclosure.

FIG. 2 is a flowchart of a method for manufacturing a semiconductor package, according to example embodiments of the present disclosure. Hereinafter, a method for manufacturing the semiconductor package 10, according to example embodiments of the present disclosure, is described with reference to FIGS. 1 and 2.

Referring to FIGS. 1 and 2, the method for manufacturing the semiconductor package 10, according to example embodiments of the present disclosure, may include (S100) determining a target CTE, (S200) adjusting the effective CTE of the semiconductor package 10 to satisfy a condition that the effective CTE of the semiconductor package 10 becomes equal to the predetermined target CTE, and (S300) performing a wafer level packaging process.

First, in operation S100, the target CTE may be predetermined based on a CTE of a circuit board on which the semiconductor package 10 is mounted. In example embodiments, the target CTE may be determined to be a value between 60% and 90% of the CTE of the circuit board.

Next, in operation S200, the effective CTE of the semiconductor package 10 may be calculated based on the thickness 100T and the CTE of the first body portion 100 of the semiconductor package 10 and the thickness and the CTE of each of the insulating layers stacked on at least one of the first surface 108 and the second surface 109 of the first body portion 100. In operation S200, the thickness 100T and the CTE of the first body portion 100 and the thickness and the CTE of each of the insulating layers of the structure 200 may be determined so that the effective CTE of the semiconductor package 10 becomes equal to the predetermined target CTE.

Next, in operation S300, the semiconductor package 10 may be manufactured to satisfy the condition determined in operation S200. That is, the semiconductor package 10 may be manufactured to have the determined thickness 100T and CTE of the first body portion 100 and the determined thickness and CTE of each of the insulating layers of the structure 200.

Figure 3:
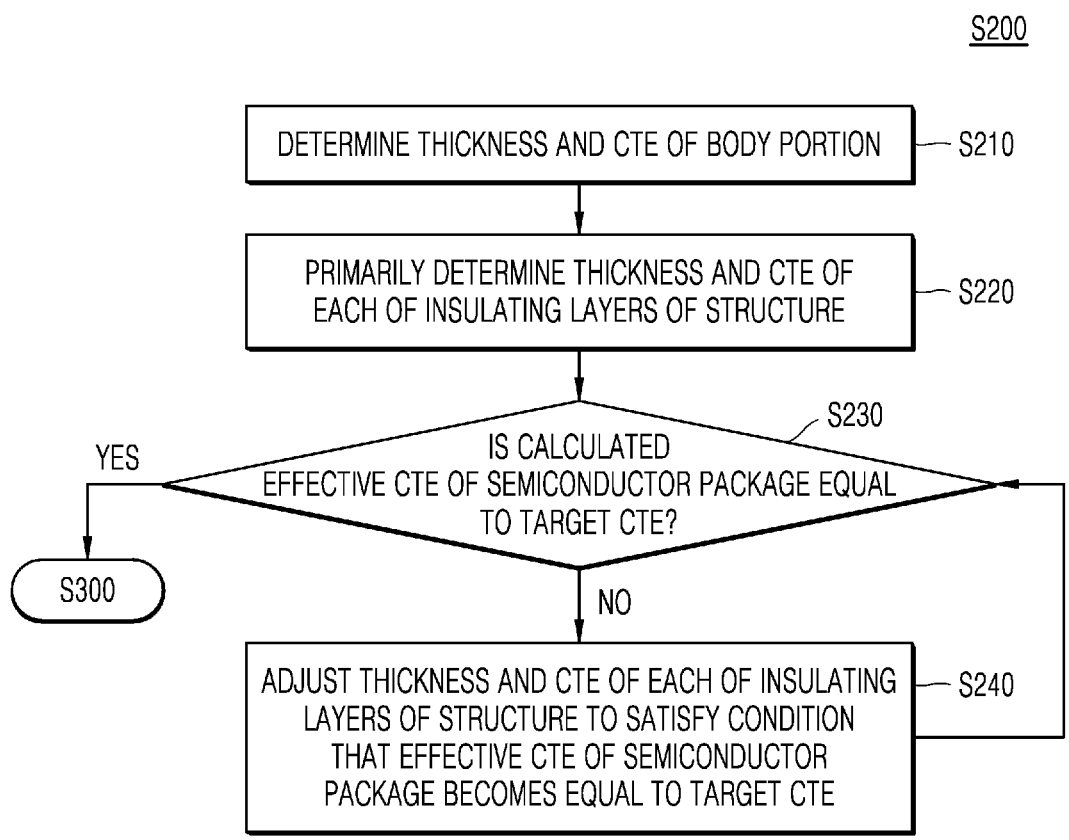
FIG. 3 is a flowchart of operation S200 of FIG. 2.

FIG. 3 is a flowchart of operation S200 of FIG. 2.

Referring to FIGS. 1 to 3, in example embodiments of the present disclosure, operation S200 may include (S210) determining the thickness 100T and the CTE of the first body portion 100, (S220) primarily determining the thickness and the CTE of each of the insulating layers of the structure 200, (S230) calculating the effective CTE of the semiconductor package 10 and determining whether the effective CTE of the semiconductor package 10 is equal to the predetermined target CTE, and (S240) adjusting the thickness and the CTE of each of the insulating layers of the structure 200 to satisfy the condition that the calculated effective CTE of the semiconductor package 10 becomes equal to the predetermined target CTE.

In operation S210, like the semiconductor package 10 shown in FIG. 1, when the first body portion 100 includes only the first semiconductor chip 110, the thickness 100T and the CTE of the first body portion 100 may be determined by a thickness and a CTE of the first semiconductor chip 110.

In operation S220, a thickness and a CTE of each of the first to third insulating layers 2111, 2113, and 220 are primarily determined. In some example embodiments, thicknesses 2111T, 2113T, and 220T of the first to third insulating layers 2111, 2113, and 220 may be determined so that a value obtained by summing the thicknesses 2111T, 2113T, and 220T of the first to third insulating layers 2111, 2113, and 220 and the thickness 100T of the first body portion 100 becomes equal to a predetermined target thickness of the semiconductor package 10.

In operation S230, the effective CTE of the semiconductor package 10 is calculated based on the determined thickness 100T and CTE of the first body portion 100 and the determined thickness and CTE of each of the first to third insulating layers 2111, 2113, and 220. It may be determined whether the calculated effective CTE of the semiconductor package 10 is equal to the target CTE. Herein, the determining of whether the calculated effective CTE of the semiconductor package 10 is equal to the target CTE may include determining whether the calculated effective CTE of the semiconductor package 10 has the same value or a value within an error range as or from the predetermined target CTE, or determining whether the calculated effective CTE of the semiconductor package 10 is within an allowable range of the predetermined target CTE.

If it is determined in operation S230 that the calculated effective CTE of the semiconductor package 10 is different from the target CTE, (S240) adjusting the thickness and the CTE of each of the insulating layers of the structure 200 to satisfy the condition that the effective CTE of the semiconductor package 10 becomes equal to the target CTE may be performed.

In operation S240, the thickness and the CTE of each of the insulating layers of the structure 200 may be adjusted to satisfy the condition that the effective CTE of the semiconductor package 10 becomes equal to the target CTE.

In example embodiments, in operation S240, the thickness of each of the insulating layers of the structure 200 may be adjusted so that a thickness of the semiconductor package 10 satisfies the predetermined target thickness. That is, in the semiconductor package 10 shown in FIG. 1, the thickness of each of the first to third insulating layers 2111, 2113, and 220 may be adjusted to satisfy a condition that a value obtained by summing the thicknesses 2111T, 2113T, and 220T of the first to third insulating layers 2111, 2113, and 220 and the thickness 100T of the first body portion 100 becomes equal to the predetermined target thickness of the semiconductor package 10.

In example embodiments, operation S240 may include adjusting the CTE of each of the insulating layers of the structure 200 to satisfy a condition that the effective CTE of the semiconductor package 10 becomes equal to the target CTE. For example, to adjust the CTE of each of the insulating layers of the structure 200, a material constituting each of the insulating layers of the structure 200 may be changed. For example, to adjust the CTE of each of the insulating layers of the structure 200, a type, a size, and/or content of a filler added to a polymer material layer constituting an insulating layer may be adjusted. For example, a CTE of an insulating layer may be adjusted by adding an inorganic filler to a polymer material layer constituting the insulating layer. For example, to decrease the CTE of the insulating layer, content of an inorganic filler added to the insulating layer may be increased.

If it is determined in operation S230 that the calculated effective CTE of the semiconductor package 10 is equal to the target CTE, a wafer level packaging process may be performed to satisfy a determined condition in operation S300. By the wafer level packaging process, the semiconductor package 10 may be manufactured so that the first body portion 100 and the insulating layers of the structure 200 have the thicknesses and CTEs determined above.

Table 1 below illustrates the thickness and the CTE of the first semiconductor chip 110 and the thickness and the CTE of each of the first to third insulating layers 2111, 2113, and 220, which are determined in operation S200 for the semiconductor package 10 shown in FIG. 1.

TABLE 1

|  | Thickness (μm) | CTE (ppm/K) |
|---|---|---|
| First insulating layer 2111 | 10 | 40 |
| Second insulating layer 2113 | 30 | 33 |
| First semiconductor chip 110 | 300 | 2.6 |
| Third insulating layer 220 | 50 | 60 |

First, in operation S210, as illustrated in Table 1, because the first body portion 100 includes only the first semiconductor chip 110, the thickness 100T of the first body portion 100 may be 300 μm that is the thickness of the first semiconductor chip 110, and the CTE of the first body portion 100 may be 2.6 ppm/K that is the CTE of the first semiconductor chip 110. In addition, in operation S220, the thickness 2111T and the CTE of the first insulating layer 2111 may be determined as 30 μm and 40 ppm/K, respectively, the thickness 2113T and the CTE of the second insulating layer 2113 may be determined as 30 μm and 33 ppm/K, respectively, and the thickness 220T and the CTE of the third insulating layer 220 may be determined as 50 μm and 60 ppm/K, respectively. When the semiconductor package 10 satisfies a condition of Table 1, the effective CTE of the semiconductor package 10, which is obtained using Equation (1), is 13.3 ppm/K, and thus, it may be confirmed that the effective CTE of the semiconductor package 10 approaches a CTE of a circuit board. In the present embodiment, thicknesses and CTEs of components constituting the semiconductor package 10 may be designed to satisfy a condition that the effective CTE of the semiconductor package 10 becomes equal to a target CTE set based on a CTE of a circuit board on which the semiconductor package 10 is mounted. Accordingly, deformation such as warpage may be suppressed to manufacture the semiconductor package 10 of which the reliability can be improved.

Figure 4:
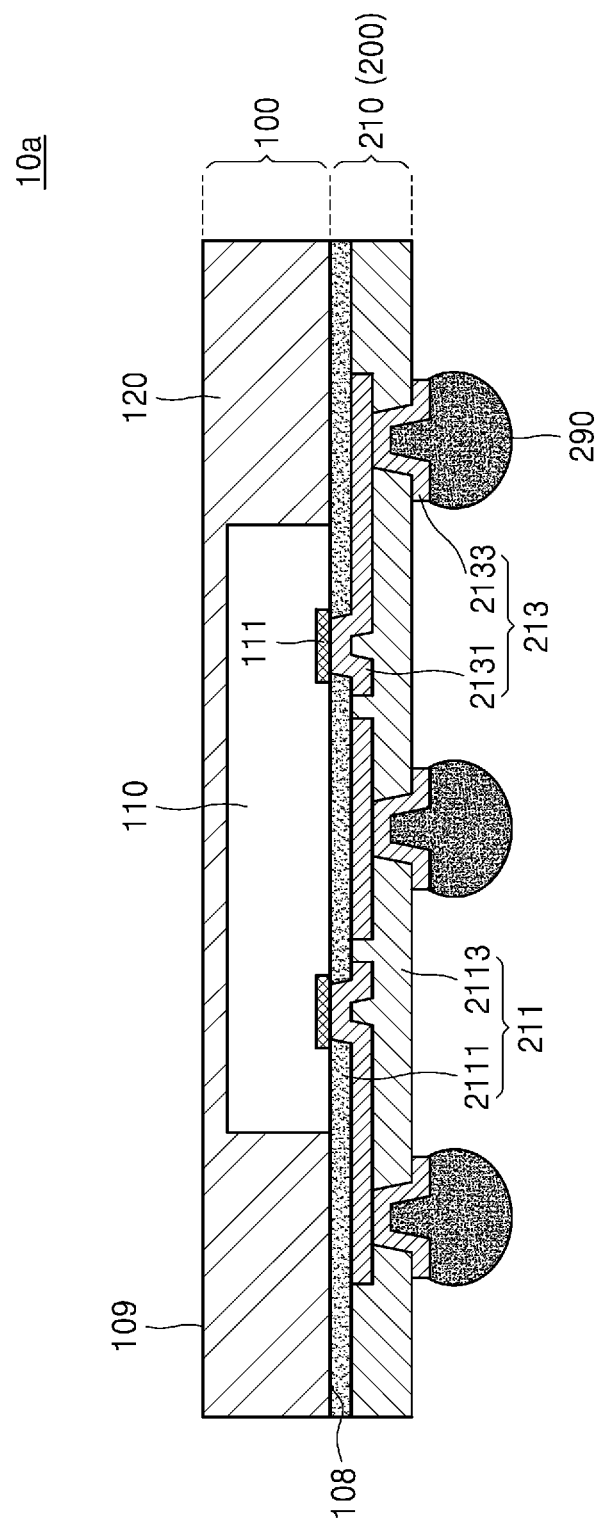
FIG. 4 is a cross-sectional view of a semiconductor package according to example embodiments of the present disclosure.

FIG. 4 is a cross-sectional view of a semiconductor package 10a according to example embodiments of the present disclosure.

The semiconductor package 10a shown in FIG. 4 may be generally the same as or similar to the semiconductor package 10 described with reference to FIG. 1 except that the first body portion 100 further includes a first molding layer 120, and the third insulating layer 220 is omitted. A description made above is omitted or simply repeated.

Referring to FIG. 4, the semiconductor package 10a may include the first body portion 100 including the first semiconductor chip 110 and the first molding layer 120, and the first redistribution structure 210 on the first surface 108 of the first body portion 100. The semiconductor package 10a may have, for example, a fan-out wafer level package (FOWLP) structure.

The first molding layer 120 of the first body portion 100 may cover at least a portion of the first semiconductor chip 110. As shown in FIG. 4, the first molding layer 120 may cover a side surface of the first semiconductor chip 110 and the back side of the first semiconductor chip 110. In other example embodiments, the first molding layer 120 may be formed to cover the side surface of the first semiconductor chip 110 but not to cover the back side of the first semiconductor chip 110.

For example, the first molding layer 120 may include an epoxy molding compound. Surely, the first molding layer 120 is not limited to the epoxy molding compound and may include various materials, e.g., an epoxy-group material, a thermosetting material, a thermoplastic material, an ultraviolet (UV) treatment material, and the like.

In example embodiments, a CTE of the first body portion 100 may be detected through simulations or experiments. In example embodiments, the CTE of the first body portion 100 may be between 3 ppm/K and 15 ppm/K.

In example embodiments, in an operation of determining the CTE of the first body portion 100, the CTE of the first body portion 100 may be adjusted by changing a material constituting the first molding layer 120 or adjusting a type of a polymer material layer constituting the first molding layer 120 or a type, a size, and/or content of a filler contained in the polymer material layer constituting the first molding layer 120. For example, the first molding layer 120 may include a polymer material layer and an inorganic filler contained in the polymer material layer. In this case, to decrease a CTE of the first molding layer 120, content of the inorganic filler added to the polymer material layer may be increased. Alternatively, to increase the CTE of the first molding layer 120, the content of the inorganic filler added to the polymer material layer may be decreased.

In the present embodiment, it may be defined that the structure 200 of the semiconductor package 10a includes the first redistribution structure 210 on the first surface 108 of the first body portion 100. The structure 200 may include the first insulating layer 2111 and the second insulating layer 2113 stacked on the first surface 108 of the first body portion 100. In this case, an effective CTE of the semiconductor package 10a may be calculated based on a thickness and the CTE of the first body portion 100 and the thickness and the CTE of each of the first and second insulating layers 2111 and 2113.

Figure 5:
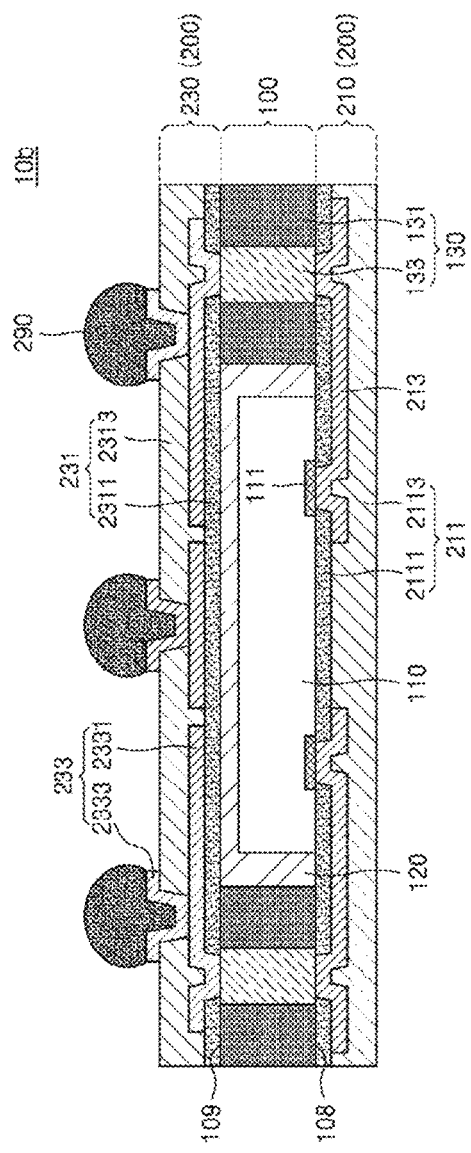
FIG. 5 is a cross-sectional view of a semiconductor package according to example embodiments of the present disclosure.

FIG. 5 is a cross-sectional view of a semiconductor package 10b according to example embodiments of the present disclosure.

The semiconductor package 10b shown in FIG. 5 may be generally the same as or similar to the semiconductor package 10a described with reference to FIG. 4 except that the first body portion 100 further includes a frame 130 and a second redistribution structure 230. A description made above is omitted or simply repeated.

Referring to FIG. 5, the first body portion 100 may further include the frame 130 around the first semiconductor chip 110. The frame 130 may be integrated with the first semiconductor chip 110 by the first molding layer 120. For example, the frame 130 may have a ring shape extending along the side surface of the first semiconductor chip 110 to surround the side surface of the first semiconductor chip 110. Alternatively, the first body portion 100 may include a plurality of frames 130 separated from each other. As shown in FIG. 5, a side surface of the frame 130 may be exposed to the outside. In other example embodiments, the side surface of the frame 130 may be covered by the first molding layer 120.

In example embodiments, the frame 130 may include a frame body 131 and a through electrode 133. The frame body 131 may include, for example, an insulating material. For example, the frame body 131 may include silicon, ceramic, plastic, polymer, glass, or the like. The through electrode 133 may pass through the frame body 131. The through electrode 133 may include a conductive material. For example, the through electrode 133 may include a metal material such as Cu, Al, or W or doped polysilicon. The through electrode 133 may electrically connect the first conductive redistribution pattern 213 of the first redistribution structure 210 to a second conductive redistribution pattern 233 of the second redistribution structure 230.

In example embodiments, a CTE of the first body portion 100 may be detected through simulations or experiments. In example embodiments, the CTE of the first body portion 100 may be between 4 ppm/K and 15 ppm/K.

In example embodiments, in an operation of determining the CTE of the first body portion 100, the CTE of the first body portion 100 may be adjusted by changing a material constituting the frame 130.

The second redistribution structure 230 may be a structure provided on the second surface 109 of the first body portion 100 and formed through a redistribution process. The second redistribution structure 230 may include a second redistribution insulating layer 231 and the second conductive redistribution pattern 233.

The second redistribution insulating layer 231 may include a plurality of insulating layers sequentially stacked on the second surface 109 of the first body portion 100. For example, the second redistribution insulating layer 231 may include a fourth insulating layer 2311 and a fifth insulating layer 2313 sequentially stacked on the second surface 109 of the first body portion 100. In example embodiments, each of the fourth insulating layer 2311 and the fifth insulating layer 2313 may have the same planar area as the first body portion 100. Unlike illustrated in FIG. 5, the second redistribution insulating layer 231 may have a structure having one insulating layer or three or more insulating layers stacked therein.

Each of the fourth insulating layer 2311 and the fifth insulating layer 2313 may include an insulating polymer, epoxy, or a combination thereof. For example, each of the fourth insulating layer 2311 and the fifth insulating layer 2313 may include a material layer including an organic polymer material. For example, each of the fourth insulating layer 2311 and the fifth insulating layer 2313 may include a material layer including a photosensitive material or a material layer including a non-photosensitive material. For example, each of the fourth insulating layer 2311 and the fifth insulating layer 2313 may include PSPI or non-photosensitive polyimide. Alternatively, each of the fourth insulating layer 2311 and the fifth insulating layer 2313 may include an oxide or a nitride. The fourth insulating layer 2311 and the fifth insulating layer 2313 may include the same material or different materials.

The second conductive redistribution pattern 233 may be covered by the second redistribution insulating layer 231. The second conductive redistribution pattern 233 may be electrically connected to the chip pad 111 of the first semiconductor chip 110 through the through electrode 133 of the frame 130 and the first conductive redistribution pattern 213 of the first redistribution structure 210. For example, the second conductive redistribution pattern 233 may include a third conductive pattern 2331 and a fourth conductive pattern 2333.

The third conductive pattern 2331 may include a line pattern between the fourth insulating layer 2311 and the fifth insulating layer 2313 and extending in the horizontal direction along the surface of the fourth insulating layer 2311, and a via pattern extending through an opening portion of the fourth insulating layer 2311 configured to expose an upper end of the through electrode 133. The via pattern of the third conductive pattern 2331 may extend along a side wall of the fourth insulating layer 2311, which is formed by the opening portion of the fourth insulating layer 2311, and electrically connect the line pattern of the third conductive pattern 2331 to the through electrode 133. The fourth conductive pattern 2333 may be physically/electrically connected to the third conductive pattern 2331 through an opening portion of the fifth insulating layer 2313 configured to expose a portion of the third conductive pattern 2331. For example, a portion of the fourth conductive pattern 2333 may extend along a side wall of the fifth insulating layer 2313, which is formed by the opening portion of the fifth insulating layer 2313, and the other portion of the fourth conductive pattern 2333 may extend along an upper surface of the fifth insulating layer 2313. In example embodiments, the fourth conductive pattern 2333 functions as an external connection pad and may be, for example, a UBM. The external connection terminal 290 may be on the fourth conductive pattern 2333.

For example, each of the third conductive pattern 2331 and the fourth conductive pattern 2333 may include Cu, Al, W, Ti, Ta, In, Mo, Mn, Co, Sn, Ni, Mg, Re, Be, Ga, Ru, or a combination thereof. The third conductive pattern 2331 and the fourth conductive pattern 2333 may include the same material or different materials.

In the present embodiment, it may be defined that the structure 200 of the semiconductor package 10b includes the first redistribution structure 210 on the first surface 108 of the first body portion 100, and the second redistribution structure 230 on the second surface 109 of the first body portion 100. The structure 200 may include the first insulating layer 2111 and the second insulating layer 2113 sequentially stacked on the first surface 108 of the first body portion 100, and the fourth insulating layer 2311 and the fifth insulating layer 2313 sequentially stacked on the second surface 109 of the first body portion 100. In this case, an effective CTE of the semiconductor package 10b may be calculated based on a thickness and the CTE of the first body portion 100, the thickness and the CTE of each of the first and second insulating layers 2111 and 2113, and a thickness and a CTE of each of the fourth and fifth insulating layers 2311 and 2313.

Figure 6:
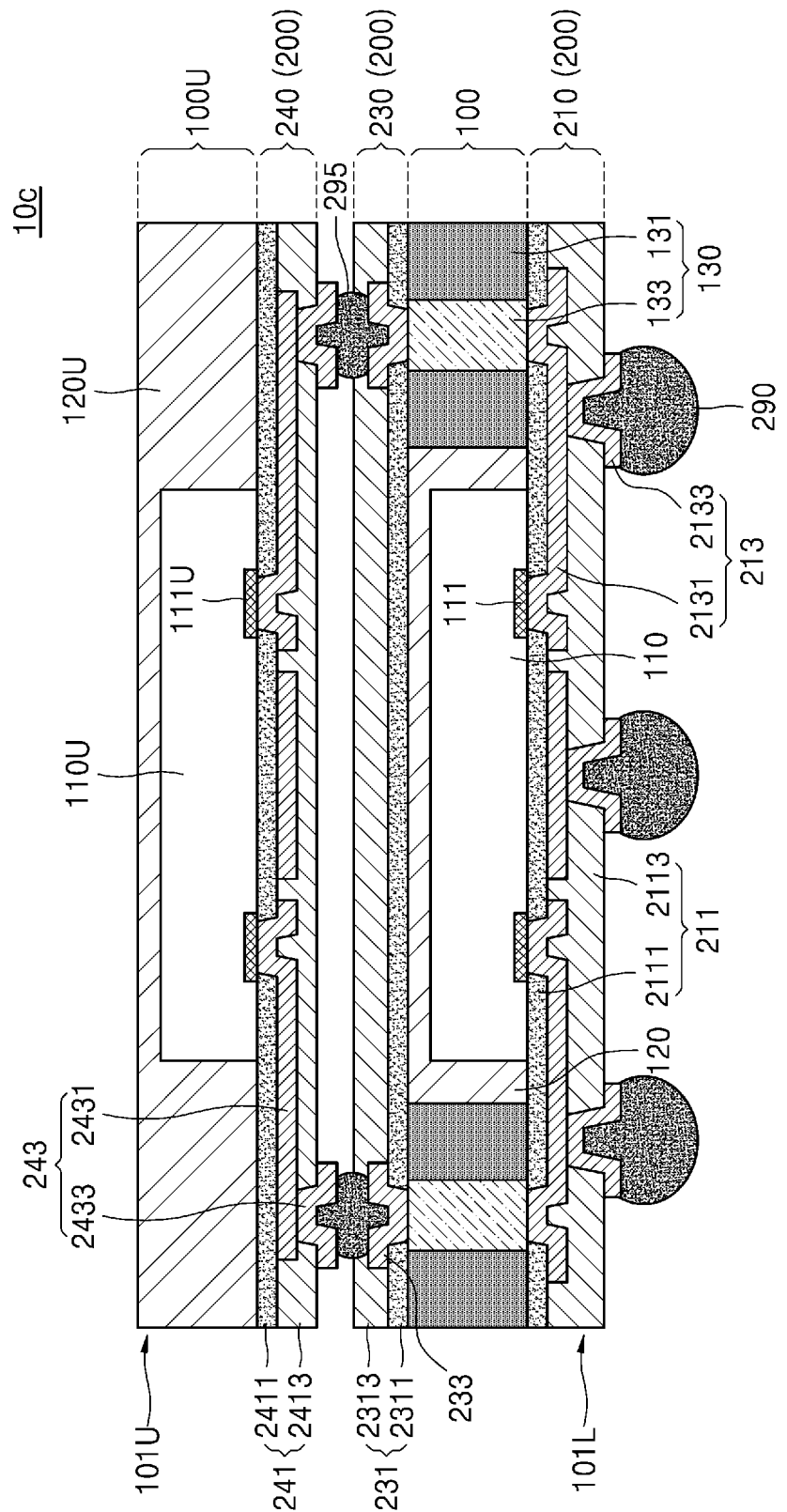
FIG. 6 is a cross-sectional view of a semiconductor package according to example embodiments of the present disclosure.

FIG. 6 is a cross-sectional view of a semiconductor package 10c according to example embodiments of the present disclosure.

Referring to FIG. 6, the semiconductor package 10c may have a package on package structure in which an upper package 101U is stacked on a lower package 101L.

For example, the upper package 101U may be stacked on the lower package 101L through an inter-package connection terminal 295.

The lower package 101L may include the first body portion 100, the first redistribution structure 210, and the second redistribution structure 230. The lower package 101L may be substantially the same as or similar to the semiconductor package 10b described with reference to FIG. 5, and thus, a detailed description thereof is omitted herein.

The upper package 101U may include a second body portion 1000 including a second semiconductor chip 110U and a second molding layer 120U, and a third redistribution structure 240 on a lower surface of the second body portion 1000.

The second semiconductor chip 110U may be the same type as or a different type from that of the first semiconductor chip 110 included in the lower package 101L. The second molding layer 120U may be formed to cover at least a portion of the second semiconductor chip 110U. The second semiconductor chip 110U and the second molding layer 120U may constitute the second body portion 100U.

The third redistribution structure 240 may include a third redistribution insulating layer 241 including a sixth insulating layer 2411 and a seventh insulating layer 2413 sequentially stacked on the lower surface of the second body portion 100U, and a third conductive redistribution pattern 243 covered by the third redistribution insulating layer 241. The third conductive redistribution pattern 243 may include a fifth conductive pattern 2431 between the sixth insulating layer 2411 and the seventh insulating layer 2413 and electrically connected to a chip pad 111U of the second semiconductor chip 110U through an opening portion of the sixth insulating layer 2411, and a sixth conductive pattern 2433 connected to the fifth conductive pattern 2431 through an opening portion of the seventh insulating layer 2413 and connected to the inter-package connection terminal 295. The third conductive redistribution pattern 243 may electrically connect the chip pad 111U of the second semiconductor chip 110U to the inter-package connection terminal 295.

In the present embodiment, it may be defined that the semiconductor package 10c includes the first body portion 100 and the second body portion 100U, and the structure 200 of the semiconductor package 10c includes the first redistribution structure 210, the second redistribution structure 230, and the third redistribution structure 240. The structure 200 may include the first insulating layer 2111, the second insulating layer 2113, the fourth insulating layer 2311, and the fifth insulating layer 2313 of the lower package 101L, and the sixth insulating layer 2411 and the seventh insulating layer 2413 of the upper package 101U. In this case, an effective CTE of the semiconductor package 10c may be calculated based on the thickness and the CTE of the first body portion 100 of the lower package 101L, a thickness and a CTE of the second body portion 1000 of the upper package 101U, the thickness and the CTE of each of the first and second insulating layers 2111 and 2113, the thickness and the CTE of each of the fourth and fifth insulating layers 2311 and 2313, and a thickness and a CTE of each of the sixth and seventh insulating layers 2411 and 2413.

Figure 7:
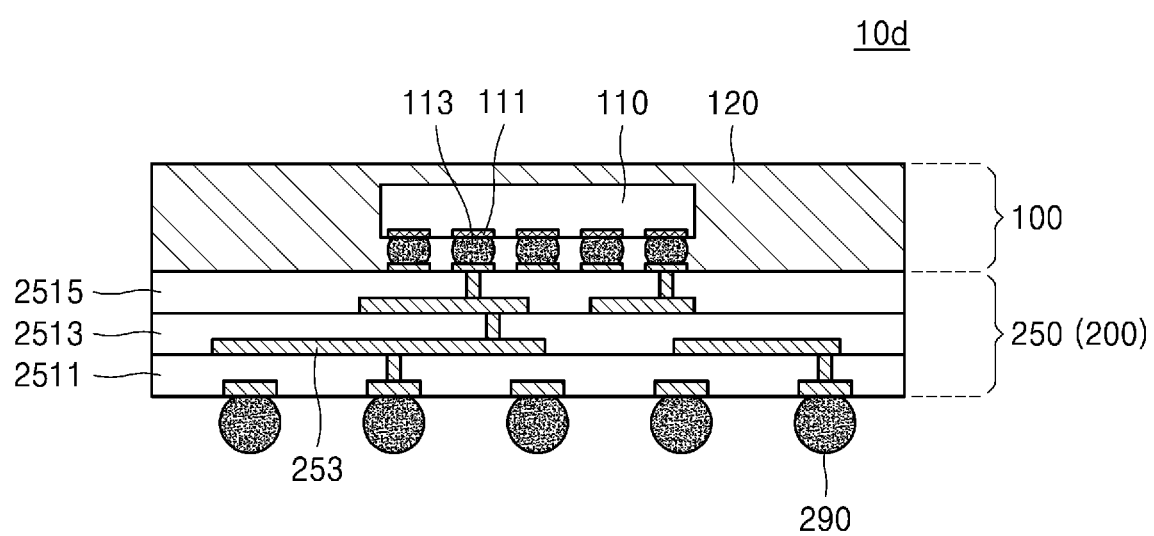
FIG. 7 is a cross-sectional view of a semiconductor package according to example embodiments of the present disclosure.

FIG. 7 is a cross-sectional view of a semiconductor package 10d according to example embodiments of the present disclosure.

Referring to FIG. 7, the semiconductor package 10d may include an interposer 250 and the first semiconductor chip 110 mounted on the interposer 250. The first semiconductor chip 110 may be mounted on the interposer 250 in a flip chip manner. That is, a chip connection terminal 113 such as a micro bump may be between the first semiconductor chip 110 and the interposer 250.

In addition, the semiconductor package 10d may include the first molding layer 120 covering at least a portion of the first semiconductor chip 110 and filled between the first semiconductor chip 110 and the interposer 250. A portion of the first molding layer 120 may surround the chip connection terminal 113 between the first semiconductor chip 110 and the interposer 250.

The interposer 250 may include insulating layers 2511, 2513, and 2515 stacked in the vertical direction and a conductive pattern 253 covered by the insulating layers 2511, 2513, and 2515. The conductive pattern 253 may electrically connect the chip connection terminal 113 to the external connection terminal 290 on a lower surface of the interposer 250.

In the present embodiment, the interposer 250 and the first molding layer 120 may constitute the first body portion 100 of the semiconductor package 10d, and the interposer 250 may constitute the structure 200. The structure 200 may include the insulating layers 2511, 2513, and 2515 of the interposer 250. In this case, an effective CTE of the semiconductor package 10d may be calculated based on the thickness and the CTE of the first body portion 100 and a thickness and a CTE of each of the insulating layers 2511, 2513, and 2515 of the interposer 250.

As described above, example embodiments are disclosed in the drawings and the description. While embodiments have been described by using particular terms in the specification, the terms are only used to describe the technical idea of the present disclosure but are not used to limit the meaning or limit the scope of the present disclosure set forth in the claims. Therefore, it will be understood by those of ordinary skill in the art that various modifications and equivalent other embodiments could be made from the present disclosure. Therefore, the true technical scope of the present disclosure for which protection is sought should be defined by the technical idea of the attached claims.

The invention claimed is:

1. A method for manufacturing a semiconductor package, the method comprising:
predetermining a target coefficient of thermal expansion (CTE) of the semiconductor package to correspond to a CTE of a circuit board on which the semiconductor package is to be mounted;
determining a thickness and a CTE of a body portion comprising a semiconductor chip;
determining a thickness and a CTE of each of n insulating layers (n is an integer greater than or equal to 2 and less than or equal to 100) for a structure comprising the n insulating layers stacked on at least one of a first surface and a second surface of the body portion, which are opposite to each other;
calculating an effective CTE of the semiconductor package corresponding to the determined thickness and the determined CTE of the body portion and the determined thickness and the determined CTE of each of the n insulating layers;
adjusting the determined thickness and the determined CTE of each of the n insulating layers under a condition that the effective CTE and the predetermined target CTE are the same while fixing the determined thickness and the determined CTE of the body portion; and
manufacturing the semiconductor package by performing a wafer level packaging process to have the determined thickness and the determined CTE of the body portion and the adjusted thickness and the adjusted CTE of each of the insulating layers of the structure,
wherein the effective CTE is calculated using Equation (1) below $$\text{effective } CTE = \frac{A*B + (C1*D1 + \cdots + Cn*Dn)}{A + (C1 + \cdots + Cn)} \quad (1)$$

where A denotes the determined thickness of the body portion, B denotes the CTE of the body portion, Cn denotes the determined thickness of an nth insulating layer of the n insulating layers, and Dn denotes the determined a CTE of the nth insulating layer of the n insulating layers.

2. The method of claim 1, wherein
the adjusting of the determined CTE of each of the n insulating layers further comprises adjusting content of a filler contained in each of the n insulating layers to adjust the determined CTE of each of the n insulating layers, wherein the content of the filler is between 0 wt % and 88 wt %.

3. The method of claim 1, wherein
the adjusting of the determined CTE of each of the n insulating layers further comprises adjusting a size of a filler contained in each of the n insulating layers to adjust the determined CTE of each of the n insulating layers, wherein the size of the filler is greater than 0 micrometers and less than or equal to 10 micrometers.

* * * * *